United States Patent [19]
Popielarski et al.

[11] Patent Number: 4,717,064
[45] Date of Patent: Jan. 5, 1988

[54] WAVE SOLDER FINGER SHIELD APPARATUS

[75] Inventors: Edward J. Popielarski, Laguna Hills; Kenneth D. Thomas, Anaheim, both of Calif.

[73] Assignee: Unisys Corporation, Detroit, Mich.

[21] Appl. No.: 896,703

[22] Filed: Aug. 15, 1986

[51] Int. Cl.[4] .......................... B23K 1/08; B23K 37/06
[52] U.S. Cl. ......................................... 228/39; 228/37
[58] Field of Search ............................ 228/37, 39, 215

[56] References Cited

U.S. PATENT DOCUMENTS

| | | | |
|---|---|---|---|
| 3,386,166 | 6/1968 | Tardoskegyi | 228/37 X |
| 3,616,984 | 11/1971 | Voroba | 228/39 X |
| 3,849,870 | 11/1974 | Cobaugh et al. | 228/37 X |
| 4,447,001 | 5/1984 | Allen et al. | 228/37 |
| 4,527,731 | 7/1985 | Kent et al. | 228/215 X |
| 4,545,520 | 10/1985 | Kent | 228/37 X |

FOREIGN PATENT DOCUMENTS 52264  5/1978  Japan .................................. 228/215

OTHER PUBLICATIONS

Amir-Hamzeh, E., "Fixtureless Wave Solder Conveyer System", IBM Technical Disclosure Bulletin, vol. 27, No. 6, Nov. 1984, pp. 3416-3417.

Primary Examiner—Nicholas P. Godici
Assistant Examiner—Carmine Cuda
Attorney, Agent, or Firm—Alfred W. Kozak; Nathan Cass; L. Joseph Marhoefer

[57] ABSTRACT

A set of titanium guide bars are shaped with inner angular finger shields to isolate designated underside edge areas of a printed circuit board being conveyed across a molten solder bath in a wave solder machine.

17 Claims, 11 Drawing Figures

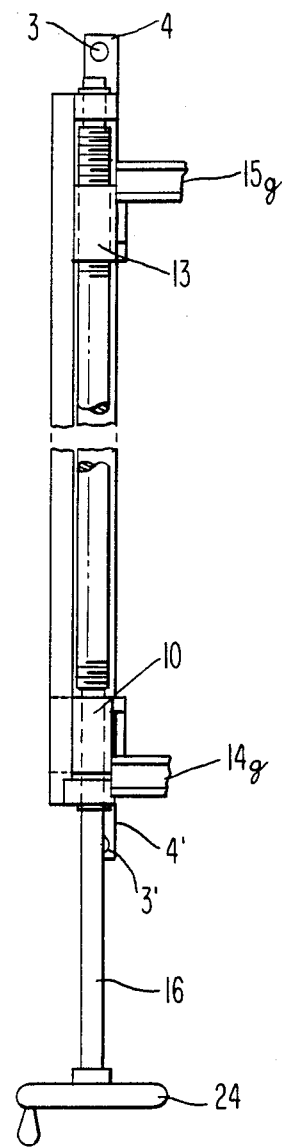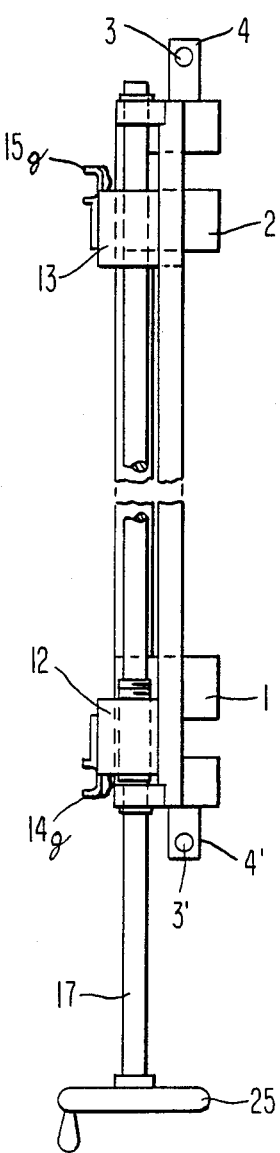

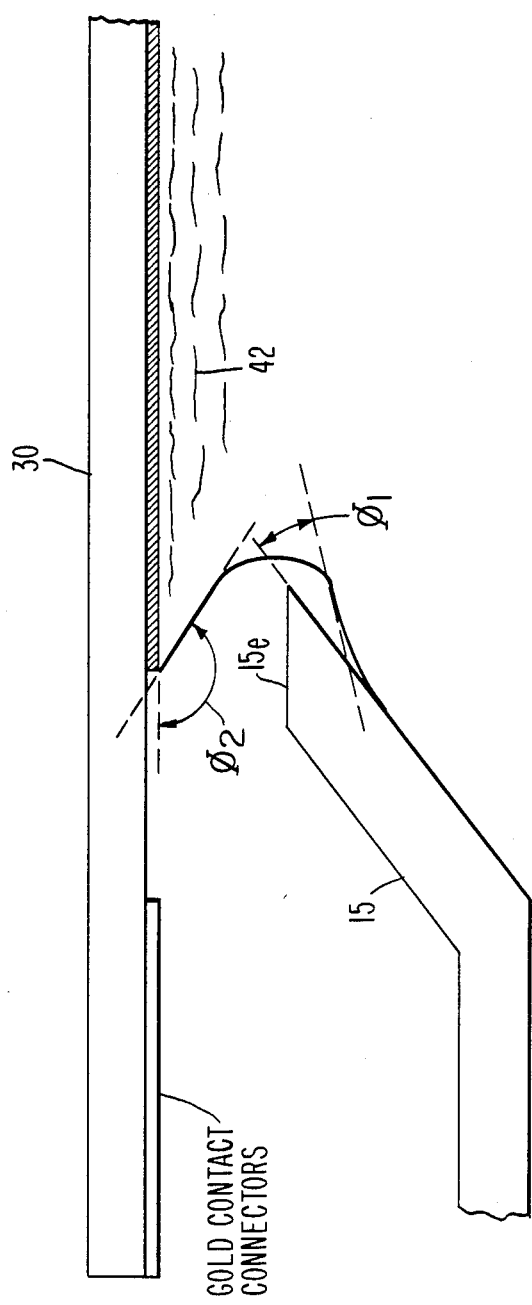

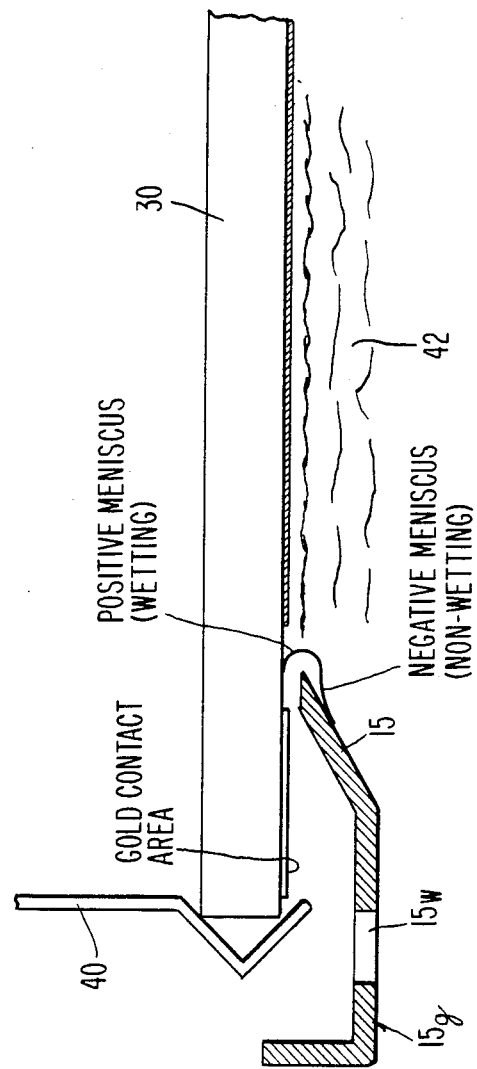

WAVE SOLDER FINGER SHIELD APPARATUS

FIELD OF THE INVENTION

This disclosure relates to manufacturing apparatus for attachment to wave solder machines for facilitating the soldering of terminals on the underside of a printed circuit board without touching or wetting the gold contact area of the printed circuit board.

BACKGROUND OF THE INVENTION

In all digital module manufacturing industries today, hundreds of thousands of printed circuit boards must be assembled with proper components mounted therein with subsequent passage through a soldering process whereby one side of the printed circuit board is subject to a soldering operation whereby hundreds of terminal points are soldered for reliable electrical connectivity.

In this manufacturing process, general usage is made of wave soldering machines whereby a conveyer having conveyer fingers will carry sequences of printed circuit boards in forward motion along a pair of guard rails whereby the underside of the printed circuit board is passed over a molten bath of solder which is agitated to rise in waves against the underside of the printed circuit board.

In this particular operation which is repeated thousands of times in digital unit manufacturing operations, it has been the standard practice to "protect" one side of the printed circuit board from being wetted or contacted by the hot molten solder. This particular protected portion of the printed circuit board is the portion comprising a series of gold contacts which connect the components mounted on the printed circuit board to the mother board or other types of connectors for operation in a ditial unit.

The general practice has been to manually apply Kapton tape to the gold contact area of each of the thousands of printed circuit boards so that when the printed circuit board passes over the wave solder pot, it is essentially insulated from contact by the hot molten solder.

There are many disadvantages to this method of protecting the gold contact areas. Since the Kapton tape is not only an unusually expensive item which is used in large quantities, but additionally, considerable and precise labor time is involved in both applying the Kapton tape initially and subsequently removing the tape from the gold plated contacts. Unfortunately, various levels of contamination of the gold contact area can occur due to the application of the adhesive Kapton tape with undesired results.

It has long been an annoying problem to attempt to find a better method of accomplishing the wave solder operation without contamination or degradation of the gold contacts.

Various attempts have been made to provide other forms of shielding devices to prevent the molten solder from wetting the gold contact area, but to this date, no outstandingly successful and efficient methods have been developed.

The presently disclosed system for efficient prevention of any solder-wetting or contact to the gold connection areas on the printed circuit board describes an apparatus which can be fitted onto a wave solder machine and which will provide a finger shield in proximity to the printed circuit board such that the hot molten solder is prevented from approaching the area of the printed circuit board which carries the gold connecting contact areas.

SUMMARY OF THE INVENTION

The newly developed auxiliary apparatus described herein provides an adjustable framework for attachment to a wave solder machine such that the conveying fingers of the wave soldering machine will be guided by the auxiliary apparatus so as to carry and convey each printed circuit board slowly across a molten solder pot (such as a T-wave solder pot) so as to accomplish the action of properly soldering all of the underside terminal contacts, yet at the same time without contacting or wetting any of the gold plated contacts along one side of the printed circuit board.

This is accomplished by the use of a frame apparatus having a front rail and a back rail to support a pair of perpendicular guide bars on which the inner sides provide a finger shield which dips into the molten solder and causes the formation of a meniscus pattern which prevents the molten solder from extending over into the gold contact area.

The finger shield is constructed of the metal titanium which has a very low molecular attraction to molten solder (tin-lead). This causes a negative (non-wetting) meniscus at the finger shield edge contact to the hot molten solder while at the same time a positive (wetting) meniscus exists between the molten solder and the underside of the printed circuit board.

With these conditions, the molten solder is caused to "wet" that portion of the underside of the printed circuit board which requires the solder terminal connections without any leakage onto that portion of the printed circuit board which carries the gold plated contact connections.

In this wise, the need to "mask" the gold contacts with expensive covering tape is eliminated in addition to reducing the cost in labor to apply and to remove the tape. Further, the cost of suitable insulating tape, such as Kapton, and any resulting contamination from glue residue is further eliminated.

The bracket apparatus which supports the guide bars holding the finger shields is capable of adjustment as between the left finger shield and right finger shield so that different size printed circuit boards can be accommodated. Two adjustment wheels, a front adjsutment wheel and a back adjustment wheel, are provided in order to provide for a precision adjustment of the left finger shield and the right finger shield so that it does not matter on which side of the printed circuit board there happens to be gold plated connection contacts, since either the left side or the right side or both can be accommodated so as to prevent any wetting or soldering operation while performing the underside solder bath operation.

BRIEF DESCRIPTION OF THE DRAWINGS

FIG. 1A is an overall plan view of the auxiliary additive bracket apparatus which can be attached to a wave solder machine so as to provide guidance of printed circuit boards across the molten solder pot and whereby in each case, the positions of the left finger shield and the position of the right finger shield cab be precisely located; FIG. 1A-1 shows a top plan view of the overall apparatus while FIG. 1A-2 shows the front guiding assembly for adjusting the distance between the left guide bar and the right guide bar; FIG. 1A-3 shows the details of the front block track; FIG. 1A-4 shows the back left guide assembly while FIG. 1A-5 indicates the details of the back block track unit.

FIG. 2 is a schematic drawing showing a printed circuit board placed in proximity to a finger shield and molten solder such that a positive meniscus and a negative meniscus is formed.

FIG. 3 is a schematic drawing showing a printed circuit board being carried by a conveyor finger and the proximate use of the titanium finger shield to provide insulation to the gold contact area of the printed circuit board.

FIG. 4 is a drawing of the right hand guide bar (14g of FIG. 1A) showing the inside edge 14 of the finger shield.

BRIEF DESCRIPTION OF PREFERRED EMBDODIMENT

Figures 1, 1A:
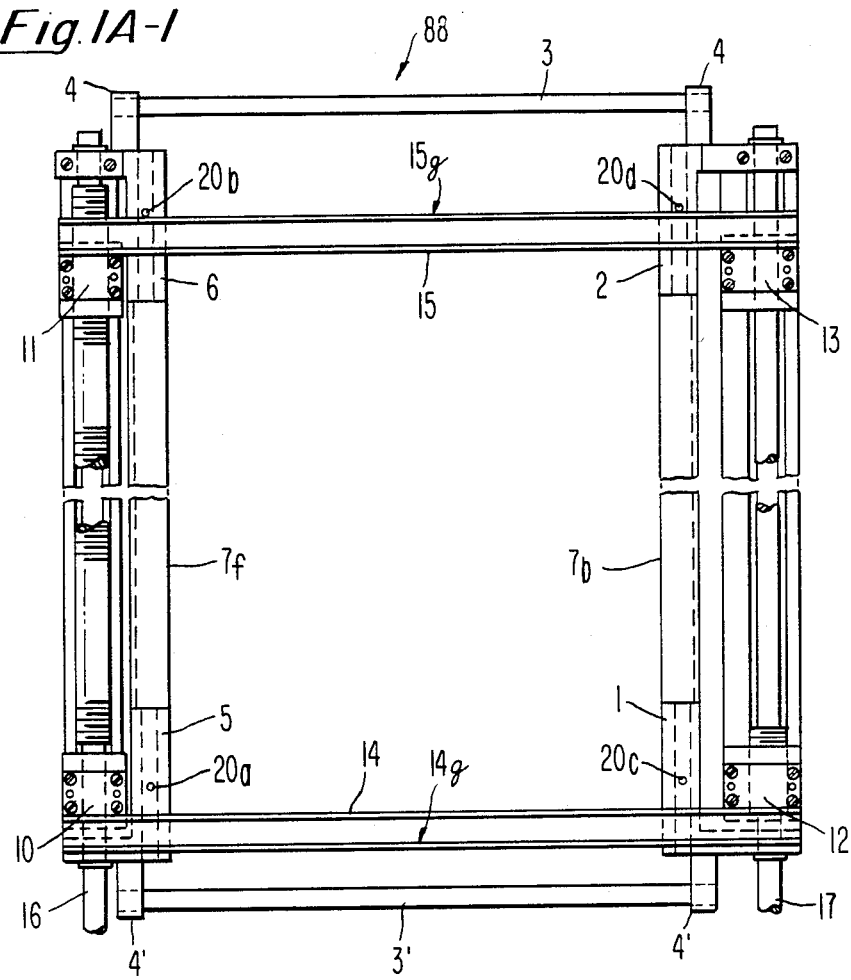
Figures 1, 1A, 2, 3:
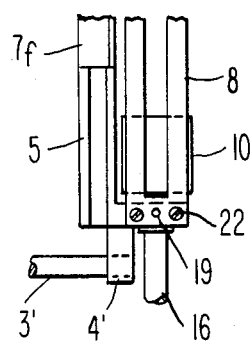
Figures 1, 1A, 2, 3, 4, 5:
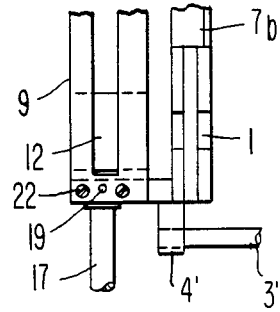
Figure 1B:
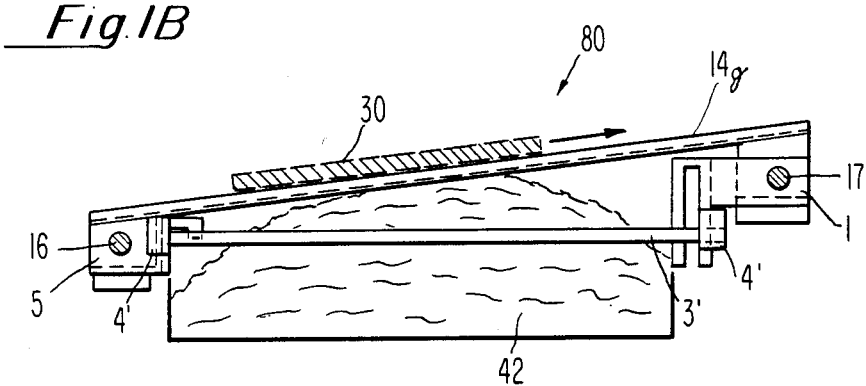
FIG. 1B is a side view of the auxiliary apparatus.
Figure 4A:
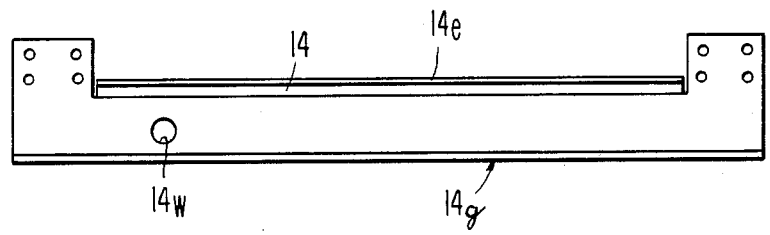
FIG. 4A is a top view and FIG. 4B is an end view of the right hand guide bar.
Figure 4B:
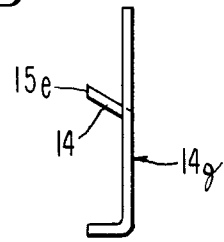
Figure 5:
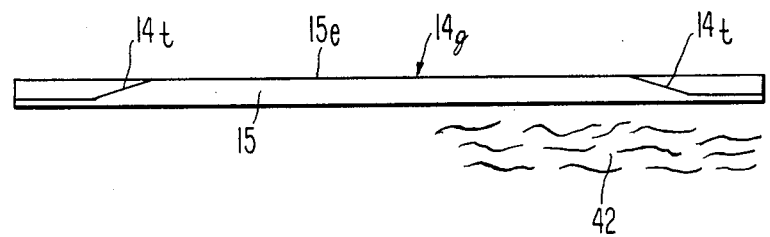
FIG. 5 is a drawing of the guide bar (14g) as it sits vertically over the solder pot (of FIG. 1A).

Referring to FIG. 1, there is seen the auxiliary portable attachment apparatus 80 for attachment onto a wave solder machine whereby the conveyor fingers 40 (FIG. 3) are engaged to carry a printed circuit board 30 across a molten wave solder bath 42 of FIG. 1B.

As seen in FIG. 1A, there is provided a frame mechanism consisting of mounting rails with a front rail 7f and a back rail 7b. The front rail 7f has a front left bracket 6 and a front right bracket 5 which attaches to and supports the guide bars 15g and 14g. Likewise at the back side there is a back left bracket 2 and a back right bracket 1 which support the other ends of the guide bars 15g and 14g.

In FIG. 1B the guide bars 14g and 15g will be seen to form the guidance mechanism through which the printed circuit board 30 is conveyed toward the molten solder bath 42. And as seen in FIG. 3 the conveyor fingers 40 are used to hold and carry the printed circuit board along the guide bars 15g and 14g in order to expose the underside of the printed circuit board onto the molten solder bath 42.

The distance between the guide bars 14g and 15g is adjustable in order to accommodate different sizes of printed circuit boards. These adjustments are accomplished by use of a front adjustment wheel 24 and a back adjustment wheel 25 shown in FIG. 1A. The height and azimuth adjustment, which regulates proximity of the finger shield edge (15e, FIG. 2) to the underside of board 30, is arranged by set screws 20a, 20b, 20c, 20d of FIG. 1A.

The guide bar 15g is provided with a left finger shield 15 which is shown in greater detail in FIG. 3. Similarly guide bar 14g provides a right finger shield 14 as seen in FIG. 1A.

The front adjustment wheel 24 activates a lead screw 16 working through guide blocks 10 and 11 in order to adjust the position of the guide bar 15g and the left finger shield 15. Similarly the back adjustment wheel 25 activates the lead screw 17 through the guide blocks 12 and 13 in order to adjust the position of guide bar 14g and the right finger shield 14. These adjustment wheels permit operator adjustment without need to approach the hot metal parts and eliminate the risk of injury due to burns.

Thus while the frame assembly 80 is resting upon the wave solder pot, a very precise adjustment is possible as to the position of the left finger shield 15 and of the right finger shield 14 in order to accommodate any size printed circuit board which is conveyed through the molten wave solder machinery.

A left stabilizer bar 3 and a right stabilizer bar 3' having mounting blocks 4 and 4' are used to provide greater rigidity to the frame structure. Additional details are shown of the back block track 9 and the front block track 8 indicating the cap screw 22 and the dowel 19.

Referring to FIG. 3 there is shown a schematic drawing indicating how the printed circuit board 30 is held and conveyed by a conveyor finger 40. This drawing shows only one side of the printed circuit board with a conveyor finger 40 in that the opposite side of the printed circuit board is held by a similar conveyor finger 40 in order to support the printed circuit board at both ends.

FIG. 3 indicates further the details of the left finger shield 15 and the guide bar 15g. A similar situation would occur on the opposite side of the printed circuit board with regard to the right finger shield 14 and the right guide bar 14g. Only one side of the printed circuit board is shown in FIG. 3.

As seen in FIG. 3 the adjustable guide bar 15g provides an optimum angular extension of approximately 30° to form the finger shield 15. The effect of the finger shield 15 is to prevent any of the hot molten solder from the wave solder pot 42 from wetting or penetrating to the area of the printed circuit board which holds the gold plated contacts. Thus the solder wetting and contact is limited only to that part of the printed circuit board where terminal points are desired to be soldered for electrical connectivity.

As seen in FIG. 2, the finger shield 15 is shown in greater detail. Since the finger shield 15 is made of titanium metal, which has the characteristic of "non-wettability" to molten solder, there is formed a negative (non-wetting) meniscus between the finger shield and the molten solder while the contact area between the terminals of the printed circuit board and the molten solder forms a positive (wetting) meniscus. The symbol PHI ($\phi$) is used to define the angle made in interface between the liquid solder and the finger shield ($\phi_1$) in one case and the angle between the liquid solder and the underside of the printed circuit board ($\phi_2$).

Since the titanium has a low molecular attraction to the molten solder which is composed of a tin-lead alloy, then the negative meniscus which is formed can be defined by using the symbol PHI ($\phi$) as a measure of the wetting angle. In the case of the negative meniscus, the wetting angle or PHI ($\phi_1$) is less than 90°. On the other hand, the wetting angle as between the underside soldering terminals of the printed circuit board and the molten solder is greater than 90°, that is to say PHI ($\phi_2$) is greater than 90° thus forming a positive meniscus.

The titanium material plus the wetting angle plus the location, shape and position of the finger shield cause the solder to be accurately controlled along a desired boundary, thus eliminating the need to "mask" the gold plated contacts with a tape covering. This provides a considerable reduction in the cost of applying and removing the tape, reduces the cost by eliminating the use of tape and also eliminates contamination which would normally occur from the glue residue on the covering tape.

Some older methods were often tried with a finger shield which was directly perpendicular to the printed circuit board at a position of approximatley one-thousandth of an inch from the printed circuit board. The severe disadvantage of this situation was that capillary action occurred between the shield and the printed circuit which pulled solder through the opening and onto the gold contact areas. This caused solder on the gold contacts which had to be removed and replated, leading to excessive and costly rework. As a result of these problems the use of Kapton tape began to be used to cover the gold contact area with all the difficulties and problems that that procedure led to, as described previously.

The particular design of the guide bar and finger shield 15 is of critical importance to the operation of the auxillary apparatus. As can be seen in FIGS. 2 and 3, the gap between the edge 15e of the finger shield 15 and the printed circuit board 30 must be on the order of fitty thousandths of an inch plus or minus twenty thousandths, that is to say 0.050 plus or minus 0.020. The finger shield 15 is raised at a 30° angle to the horizontal.

In FIG. 4, the right guide bar 14g is shown with the right finger shield 14 having the finger edge 14e.

A cutout hole called the "weep hole" 14w is used as a safety drain to release any liquid solder which may have accidently gotten into the inner area of the guide bar 14g. Likewise, for the left guide bar 15, a weep hole, 15w is provided.

In FIG. 5, there is seen the length of the finger shield edge 14e with the tapered endings 14t which help to prevent any hard collisions between the moving board 30 and the finger shield.

There has been disclosed herein an auxiliary attachment apparatus for a wave solder machine whereby printed circuit boards of various sizes and configurations can be accommodated for conveyance across the moltensolder bath of a wave solder machine. Of particular significance for the auxiliary attachment is the provision of two finger shields which can be adjustably placed at each end of the printed circuit board so as to prevent any solder wetting of the gold contacts which are to be isolated from the solder bath. The sides of the auxiliary apparatus provide two guide bars 14g and 15g which have on the inner side thereof finger shields respectively designated as 14 and 15 on each side whereby the finger shield is made of titanium and has a tapered edge coming within 0.050 plus or minus 0.020 of an inch of the printed circuit board so as to act in causing a "negative meniscus" between the titanium edge and the solder bath, thus preventing any seepage of molten solder into the gold contact area. Of considerable importance is the criticality of the angle of the finger, the edge of the finger and the proximity of the finger to the printed circuit board which is very carefully controlled.

While the above auxiliary attachment apparatus for a wave solder machine has been described in one particular embodiment, other variations thereof may be provided which effectively result in the same advantages, thus the preceeding disclosure should be considered in the light of the attached claims which follow herein.

What is claimed is:

1. An auxiliary attachment apparatus, for placement over a molten solder bath of a wave solder machine, which conveys the underside of a printed circuit board across said solder bath, said printed circuit board having a designated edge area, which is to be isolated from solder contact and a terminal area to be wetted by solder, the apparatus comprising:
   (a) support means for holding first and second guide bars for placement at the opposite edges of said underside of said printed circuit board;
   (b) said first and second guide bars placed parallel to the direction of motion of said printed circuit board and spaced to a distance slightly greater than the width of said printed circuit board;
   (c) prevention means, on said first and second guide bars for isolating designated underside edge areas, of said printed circuit board, from any contact with molten solder, said prevention means including:
      (c1) a rigid, cup-shaped, solder-repellant, metallic unit having an angular finger shield on one side thereof which rises 30° from the horizontal base to contact and repel said molten solder from said designated underside edge areas of said printed circuit board, said finger shield having a horizontal finger edge which is adjustably positioned to 50 mils plus or minus 20 mils below said underside of said printed circuit board, and parallel to said underside.

2. The apparatus of claim 1 which includes:
   (a) means for precisely adjusting the spatial separation between said first and second guide bars.

3. The apparatus of claim 2 wherein each of said first and second guide bars includes:
   (a) an aperture area to release any overflow of molten solder.

4. The apparatus of claim 1 wherein said support means includes: front and back bracket units for enabling stable attachment onto said wave solder machine.

5. The apparatus of claim 1 wherein said solder-repellant, metallic unit is made of titanium.

6. The apparatus of claim 5 wherein said angular finger shield resides in proximate relationship to said underside of said printed circuit board to establish a negative meniscus (less than 90°) between said finger shield and the adjacent molten solder in said solder bath.

7. The apparatus of claim 5 wherein said angular finger shield, proximate to said underside of said printed circuit board, establishes a positive meniscus (greater than 90°) between said molten solder and said underside of said printed circuit board.

8. The apparatus of claim 5 wherein said angular finger shield inhibits any molten solder from contacting that portion of the said underside of said printed circuit board which resides between the said finger edge and the outer edge of said printed circuit board.

9. The apparatus of claim 1 which includes:
   (a) means for adjusting the vertical height and angle elevation of said first and second guide bars.

10. In a device for attachment to a wave solder machine which uses conveyor fingers to convey printed circuit boards across a molten solder bath unit so as to effectuate electrically soldered connections on the underside of said printed circuit board, said underside of said printed circuit board including an edge connector area which is to be isolated from said molten solder, and a terminal area which is to be bathed in molten solder, the auxiliary attachment apparatus comprising:
   (a) a framing unit for rigid attachment to said wave solder machine above said molten solder bath unit, said rigid attachment framing unit including:
      (a1) front and back base brackets for attachment to said wave solder machine and for supporting left side and right side guide bars which are in alignment with the conveyor fingers of said wave solder machine;

(b) said left guide bar and said right guide bar composed of a material repellent to molten solder and shaped to provide a vertical wall barrier to said molten solder on the outer side and an angular finger shield rising 30° from the horizontal on the inner side to make contact with said molten solder so as to establish a meniscus which prevents the solder from seeping or wetting said edge connector area of said printed circuit board, said finger shield having a horizonal finger edge positioned 0.050±0.020 inches below said underside.

11. The apparatus of claim 10 wherein each said front and back base brackets includes:

(a) means for regulating the spatial separation between said left and right guide bars.

12. The apparatus of claim 10 wherein said angular finger shield is formed of three contiguous areas including:

(a) a vertical wall on the outer side;
(b) a horizontal base piece;
(c) an angular arm on the inner side which rises at an angle of 30° (plus or minus 2°) from the horizontal base piece to position a finger edge under said terminal area of said printed circuit board.

13. The apparatus of claim 10 wherein said front and back base brackets include lead screws which can be turned to adjust the location or position of said left guide bar and the said right guide bar to bring these bars into alignment with the edges of any size printed circuit board.

14. The apparatus of claim 13 wherein each of said lead screws are connected to front and back adjustment wheels which can be activated to respectively control the locational position of said left guide and said right guide bar.

15. The apparatus of claim 10 wherein said left and right guide bars are composed of titanium metal which acts to repel wetting of any molten solder that is contacted.

16. An apparatus for attachment to a wave solder machine which conveys the underside of printed circuit boards across a molten wave solder bath, said apparatus for enabling the soldering of terminal contact areas on the underside of the printed circuit board, and for isolating designated edge areas of said underside, the apparatus comprising:

(a) a front and back set of brackets for attachment above said solder bath of said wave solder machine, and wherein said wave solder machine provides conveyor fingers which carry printed circuit boards across said molten solder bath to accomplish solder-wetting of said underside terminal contacts;

(b) left and right guide bars in alignment with said conveyor fingers of said wave solder machine wherein said left and right guide bars are supported by said front and back brackets, said left and right guide bars including:

(b1) left side and right side isolation means for preventing molten solder contact with said designated edge areas, each said isolation means including:

(b1a) a titanium hull unit having a vertical face on one side and an angular finger shield on the opposite side, said finger shield rising at 30° to the horizontal and providing a horizontal finger shield edge which is positioned at a distance of 50±20 mils from the underside of said terminal contact area.

17. An auxiliary attachment apparatus for placement above the molten solder bath of a wave solder machine for isolating an underside edge area of printed circuit boards being conveyed over said solder bath, said auxiliary apparatus including:

(a) a rigid base bracket for attachment above the molten solder bath of said wave solder machine, said bracket supporting left side and right side guide bars which are adjusted into alignment with edges of printed circuit boards which are being moved by conveyor fingers of said wave solder machine;

(b) said left guide bar and said right guide bar being composed of titanium metal and having a specialized shape wherein the outer edge of each of said left and right guide bars form a vertical wall adjacent said molten solder while said inner edges of said left and right guide bars form an angularly tapered finger shield rising at 30° to the horizontal and providing a horizontal finger edge adjustable to a distance of 50±20 mils to said underside whereby said molten solder will be repelled from contacting said underside edge area.

* * * * *